United States Patent [19]

Sulzbach

[11] Patent Number: 5,502,442

[45] Date of Patent: Mar. 26, 1996

[54] METHOD OF FORMING A DURABLE WIDEBAND ANTI-REFLECTION COATING FOR INFRARED WINDOWS

[75] Inventor: Frank C. Sulzbach, Dallas, Tex.

[73] Assignee: Texas Instruments Incorporated, Dallas, Tex.

[21] Appl. No.: 474,809

[22] Filed: Jun. 7, 1995

Related U.S. Application Data

[62] Division of Ser. No. 400,606, Aug. 30, 1989.

[51] Int. Cl.⁶ .............................. H01Q 17/00; B05D 1/36
[52] U.S. Cl. ..................................... 342/2; 342/4; 427/204
[58] Field of Search ....................... 342/2, 3, 4; 427/450, 427/452, 204

[56] References Cited

U.S. PATENT DOCUMENTS

| 4,162,496 | 7/1979 | Downen et al. | 343/18 A |
| 4,716,572 | 12/1987 | Kuhn et al. | 373/88 |
| 4,972,935 | 8/1990 | Sawa et al. | 342/4 |
| 5,003,311 | 3/1991 | Roth et al. | 342/4 |
| 5,164,220 | 11/1992 | Caballero | 427/577 |
| 5,307,068 | 4/1994 | Hartemann | 342/1 |
| 5,385,623 | 1/1995 | Diaz | 156/197 |
| 5,453,303 | 9/1995 | Holcombe, Jr. et al. | 427/450 |

*Primary Examiner*—Peter A. Nelson
*Attorney, Agent, or Firm*—René E. Grossman; Richard L. Donaldson

[57] ABSTRACT

An ultra hard, wideband anti-reflection coating for an IR window, such as GaAs, which resists environmental and chemical attack. The coating is designed to allow spectral transmission therethrough in a wide band, namely the 3 to 12 micron range. A cladding layer is formed on the GaAs window. A first diamond like carbon (DLC) layer is then formed on the first bonding layer. A bonding layer is formed on the first DLC layer and a second DLC layer is formed on the bonding layer.

2 Claims, 4 Drawing Sheets

METHOD OF FORMING A DURABLE WIDEBAND ANTI-REFLECTION COATING FOR INFRARED WINDOWS

This is a divisional of application Ser. No. 07/400,606 filed Aug. 30, 1989.

This invention relates to anti-reflection coatings and more particularly to an anti-reflection coating which is environmentally and chemically durable and transmissive to a wide band of infrared (IR) energy and a method of making same.

Many applications exist today, for example in supersonic aircraft and missiles, for the need to monitor or detect IR radiation. Sensors typically operate in the IR spectral response range of 3 to 5 microns. Advances in sensor technology have led to the need for 8 to 12 micron long wave IR sensors and it appears that even greater improvement may be realized in sensing the entire 3 to 12 micron range.

Improvements in sensor technology are being impeded by lack of suitable IR dome materials and coatings which may be subjected to supersonic heating (in the range of 250° C.), thermal shock, rain erosion, aerodynamic pressure loading and air pressure gradients. Additionally, it is desirable that the domes be chemically inert and not subject to chemical attack as well as being extremely durable and transmissive in the entire 3 to 12 micron range.

Strength and far-IR transmittance typically imply contradictory requirements. Strength implies strong atomic and molecular bonds as typically achieved by atoms of low atomic weight and high bonding ability. Long IR transmittance implies large reduced masses and weaker bond strengths. Thus meeting the requirements of a wideband 3 to 12 micron dome represents a major technical challenge.

An article by Micheal J. Mirtich et al entitled "The Use of Intermediate Layers to Improve the Adherence of Diamondlike Carbon Films on ZnS and ZnSe" in the Journal of Vacuum Society Technology A 4(6), Nov./Dec. 1986, p. 2680–2681 states that diamondlike carbon (DLC) films have the potential to protect optical windows, such an ZnS and ZnSe, where it is important to maintain the integrity of the specular transmittance of the window. Mirtich et al state that the DLC films must be adherent and durable such that they protect the windows from rain and particle erosion as well as chemical attack. The article points out that applying a thin interface coating of germanium (Ge) or silicon (Si) allowed the DLC films to adhere to the zinc sulfide (ZnS) or zinc selenide (ZnSe) windows. More specifically Mirtich et al state that as shown in his FIG. 4 "although there is a reduction in transmittance at shorter wavelengths only a 1% loss occurs at 10 μm. This reduction could be eliminated by picking the proper DLC and Ge thicknesses to allow the combination to become an anti-reflective coating."

The materials described in the Mirtich et al article have some severe limitations. ZnS absorbs in the 10–12 micron range and ZnSe is soft and does not work well in harsh environments. Additionally Mirtich et al use a very thin bonding layer of Ge or Si with DLC which produces a window which is primarily transmissive at 10 microns, not the 3 to 12 micron range which is more advantageous. Still further Mirtich et al do not teach a coating having an arbitrarily thick first bonding layer and additional alternative layers of DLC and bonding layers to effect a transmissive range in the order of 3 to 12 microns. Accordingly, it is an object of the present invention to provide an IR dome or window and coating which is transmissive to IR radiation in the 3 to 12 micron range.

Another object of the present invention is to provide an IR dome or window and coating which is durable, highly resistant to rain erosion and not subject to chemical attack.

Another object of the present invention is to provide an IR dome or window and coating which is superior as to angle of incidence sensitivity and transmittance therethrough.

Another object of the present invention is to provide an anti-reflection coating using at least one layer whose index of refraction is close to the index of refraction of the window.

A still further object of the invention is to provide a method of forming an IR dome or window and coating which is both practical and economical to implement.

Other objects and features of the invention will become more readily understood from the following detailed description and appended claims when read in conjunction with the accompanying drawings, in which like reference numerals designated like parts throughout the figures thereof, and in which:

Prior art IR windows and coatings were not subject to the harsh environments and airspeeds now required by many weapon systems. For example, supersonic aircraft and missiles of the future will travel at speeds from Mach 0.8 to Mach 6. Rain erosion, i.e., rain pelting on windows and coatings, at these speeds will damage or destroy most IR windows and coatings known today. Additionally, requirements are such that these new windows and coatings must be capable of withstanding chemical attack and be transmissive at high angles of incidence, i.e., from 0° to 80°. Additionally, the window and coatings must be capable of withstanding temperatures in excess of 250° C. and be transmissive between 3 to 5 and 8 to 12 microns.

Combination of materials used in the past were not acceptable to satisfy these requirements. For example ZnSe is soft (not durable) although it has good transmittance qualities. ZnS, although cheap and fairly resistant to rain erosion, has poor transmittance at the longer wavelengths. Germanium, on the other hand, has thermal runaway above 50° C.

Figure 1:
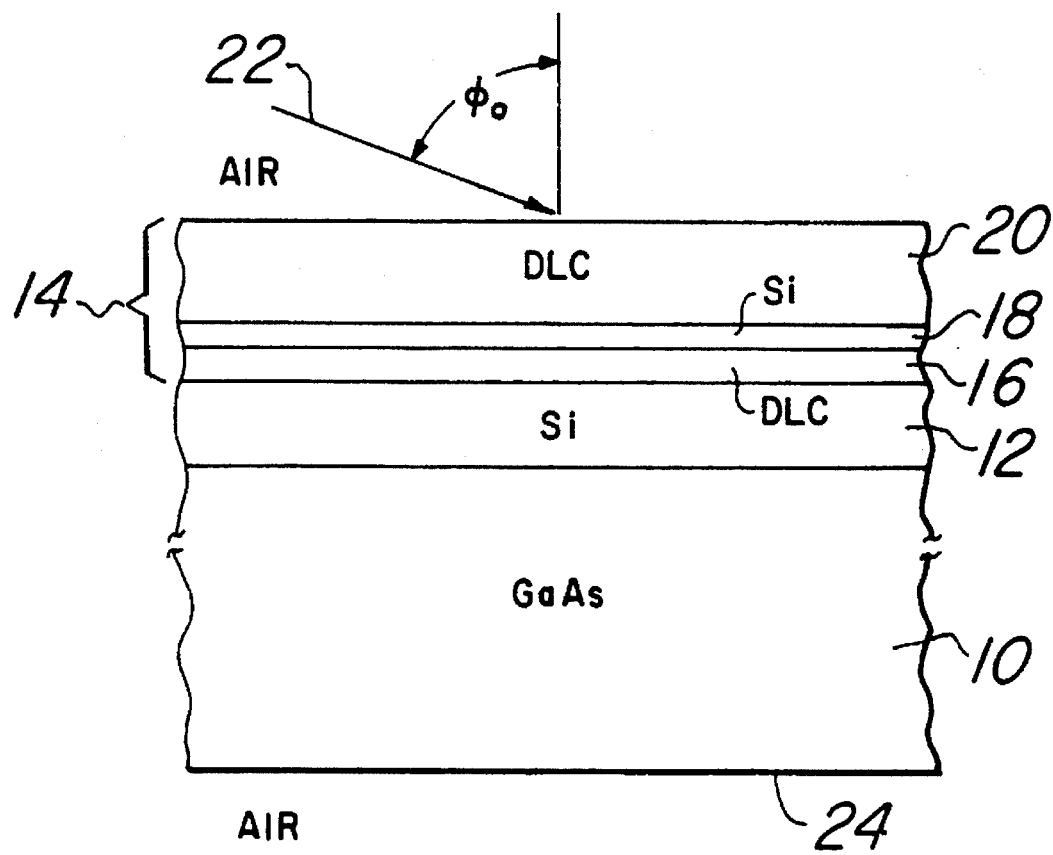
FIG. 1 illustrates an IR window and coatings constructed according to the present invention.

Referring now to FIG. 1, there is illustrated an IR anti-reflection coating and window which is extremely durable and is transmissive between 3 to 12 microns. Semiconductor window 10 typically has an index of refraction between 2.9 and 3.5 and in the preferred embodiment is gallium arsenide (GaAs) having an index of refraction of approximately 3.3; other materials may be used such as gallium phosphide (GAP) having an index of refraction of 2.9. For purposes of description of the invention, it will be assumed that window 10 is made of GaAs.

GaAs materials, such as window 10, work well at high temperatures (in excess of 250° C.) and high airspeeds, but GaAs does not perform well in adverse weather conditions, such as rain erosion. Therefore, it is desirable to have a cladding layer 12 formed on window 10 to provide durability and promote bonding for subsequent layers. Since the goal is to achieve maximum transmittance in the 3–12 micron range with high durability, it is desirable to have the index of refraction of the cladding layer 12 match the index of refraction of window 10, namely the cladding layer should also have an index of refraction between 2.9 and 3.5. The preferred material for cladding layer 12 is Si since its index of refraction is approximately 3.4, very close to GaAs which is approximately 3.3. However, other materials such as Ge may also be used.

Using Fresnel's reflection coefficient equation $$Ro = \left[ \frac{n1 - n2}{n1 + n2} \right]^2$$

where Ro =Reflectance coefficient n1 =index of refraction of Si =3.3 n2 =index of refraction of GaAs, =3.4 the reflectance coefficient at the boundary between the Si and the GaAs is $$Ro = \left[ \frac{3.3 - 3.4}{3.4 + 3.4} \right]^2 = .00022.$$

In other words in percent, the reflectance at the boundary is .022%. As a result, the transmittance though the Si cladding layer is high. Si is extremely rain and chemical resistant as well as being an excellent bonding agent for diamondlike carbon (DLC) layers. Additionally, the cladding layer 12 may be arbitrarily thick for structural and optical integrity while not affecting the transmittance through window 10. This characteristic of being able to provide an arbitrarily thick cladding layer without affecting the optical characteristics of the anti-reflection coating will be described more fully in FIGS. 3 to 8.

The multi-layer coating 14 comprised of coatings 16, 18, and 20 provides the anti-reflectance and durability features of the present invention. In the preferred embodiment, coatings 16 and 20 are diamond like carbon whereas coating 18 is silicon; alternatively coating 18 could be GaP, GaAs, Ge or other suitable material but silicon is more durable and a better bonding agent for DLC. The index of refraction of coating 18 is between 2.7 and 4.0 and should be significantly different than DLC. Using Si and DLC as coatings 12, 16, 18, and 20 allowed the achievement of a wide IR transmission band as well as being extremely durable, and highly resistant to rain erosion, chemically inert and not subject to chemical attack and capable of operating at temperatures in excess of 250° C.

Additionally it is desirable that the window and coatings be capable of transmitting IR radiation 22 at large angles of incidence Oo (measured with respect to the surface normal). With the layers optimized to have the highest transmittance at Oo=70° the coatings had the dimensions listed in the Table below.

TABLE

| Coating | | Thickness microns |
|---|---|---|
| Si coating | 12 | .73 |
| DLC coating | 16 | .24 |
| Si coating | 18 | .14 |
| DLC coating | 20 | .78 |

Figure 2:
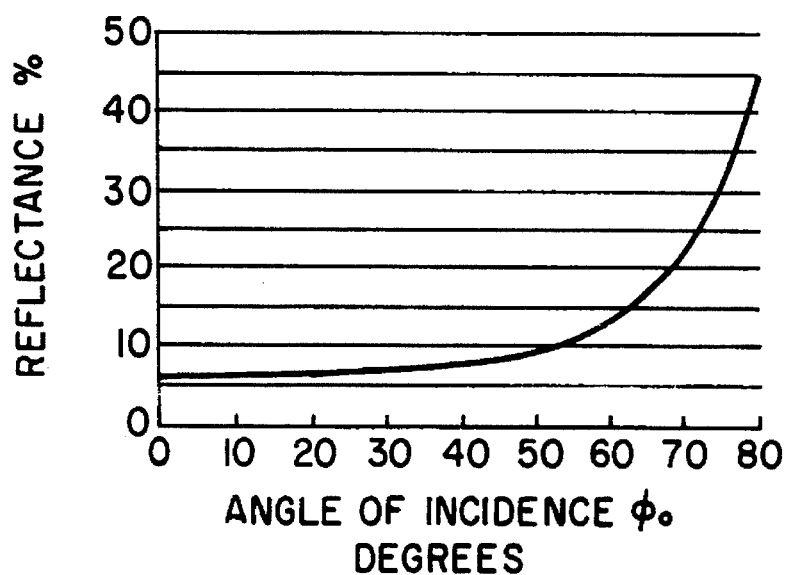
FIG. 2 illustrates the reflectance versus angle of incidence for the IR window and coatings of FIG. 1.

FIG. 2 illustrates the reflectance in percent for the window and coating in the Table above versus the angle of incidence φo of the incoming IR radiation 22 (FIG. 1). It should be noted that the reflectance curve of FIG. 2 is the average reflectance for IR wavelengths in the 3.2 to 5.0 and 7.6 to 11.0 micron range.

Figure 3:
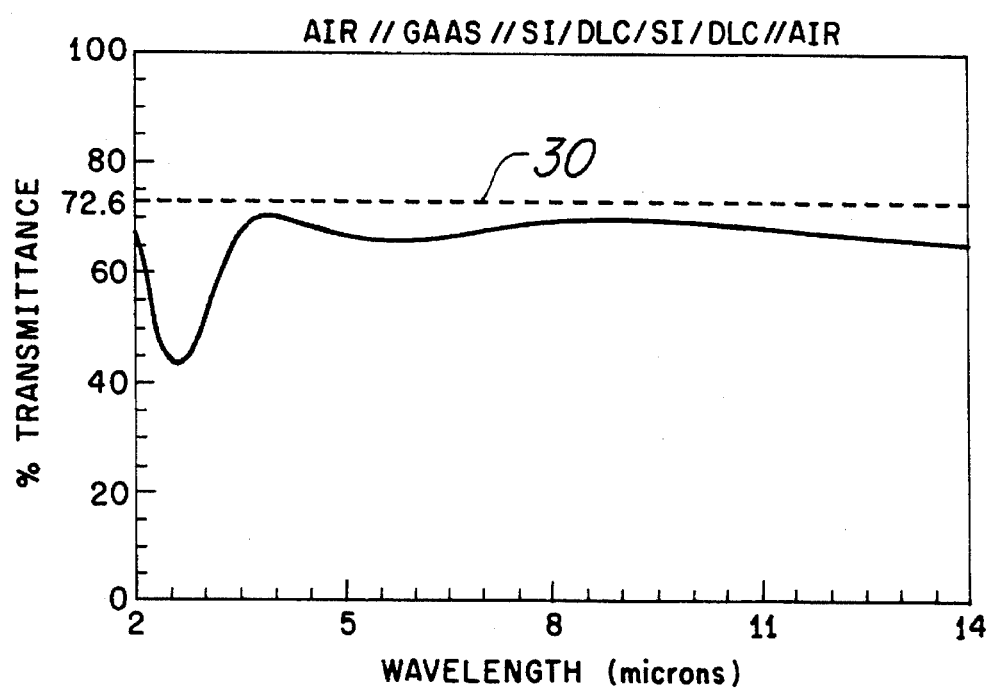
FIGS. 3–5 illustrate the transmittance versus wavelength for a GaAs window constructed according to the present invention with different cladding layer thicknesses.
Figure 4:
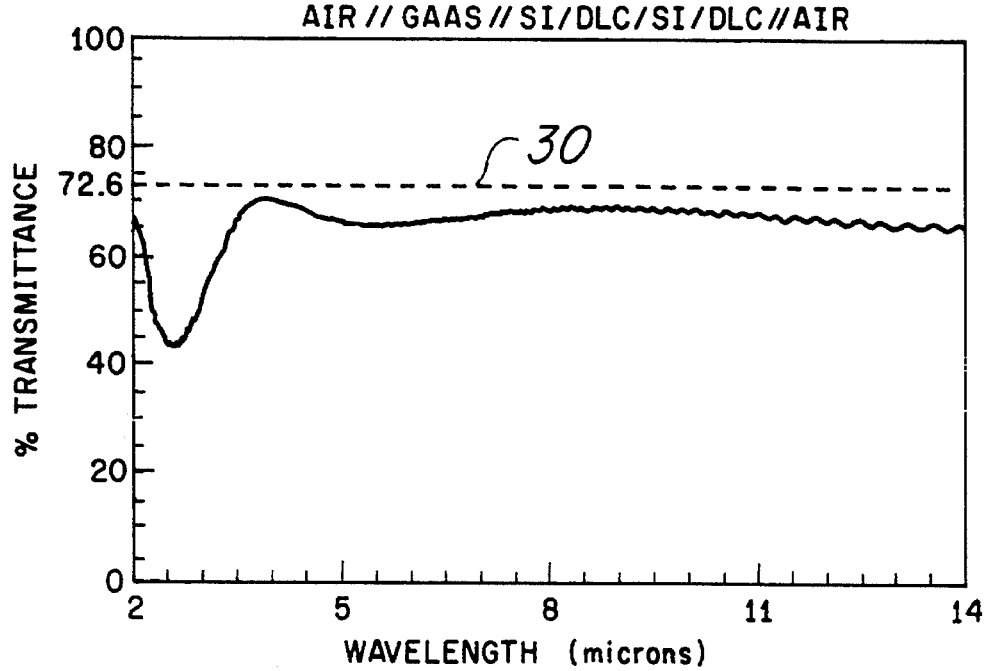
Figure 5:
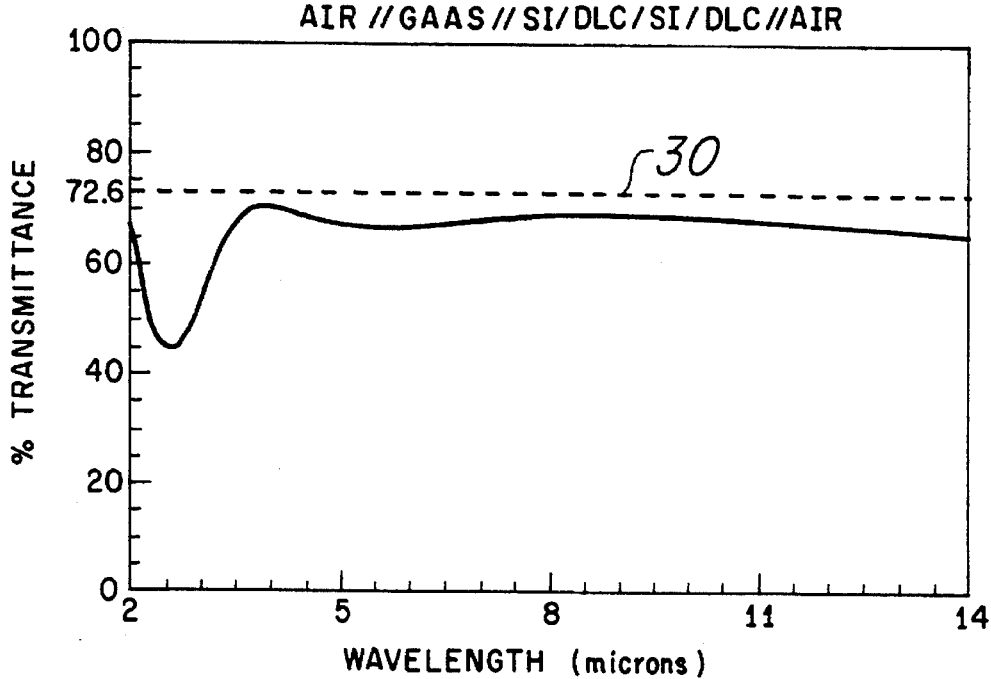

FIGS. 3–5 illustrate the percent (%) transmittance vs. wavelength in microns of the GaAs window of FIG. 1 with the dimensions of coatings 16, 18, and 20 as described in the Table above. FIG. 3 illustrates the transmittance characteristic with Si coating 12 at 0.73 microns (nominal design). FIG. 4 illustrates the transmittance with coating 12 at 100× nominal or approximately 73 microns thick. FIG. 5 illustrates the transmittance with coating 12 at 0.1× nominal or 0.073 microns thick. It can be seen that coating 12 can be arbitrarily thick to enhance the durability of the coating while not dramatically affecting the transmittance through the window and coatings. It should also be noted that the transmittance is optimized in the 3 to 5 and 8 to 12 micron range. The straight dotted line 30 at 72.6% transmittance in FIGS. 3–5 represents the maximum transmittance through the GaAs window 10 and coatings 12 and 16–20 assuming there is no anti-reflectance coating on side 24 (FIG. 1) of window 10, i.e., uncoated.

Figure 6:
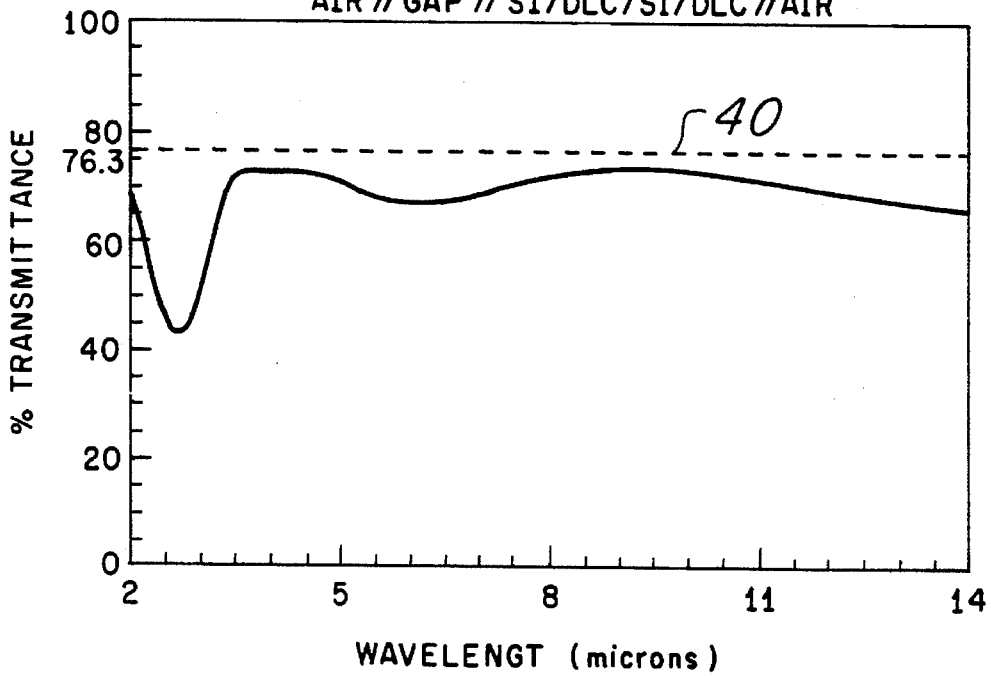
FIGS. 6–8 illustrate the transmittance versus wavelength for a GaP window constructed according to the present invention with different cladding layer thicknesses.
Figure 7:
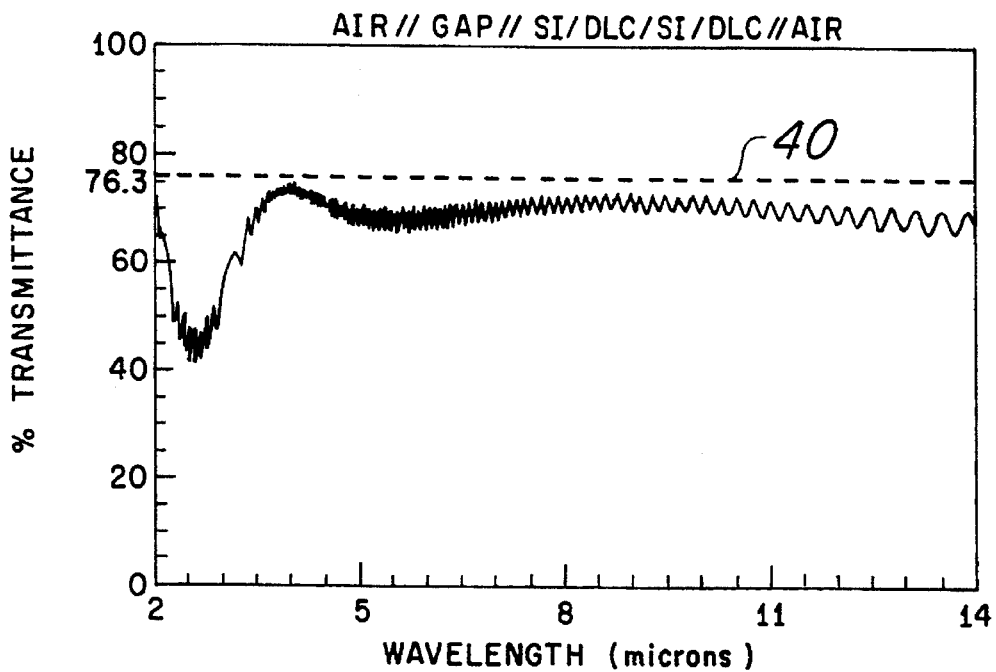
Figure 8:
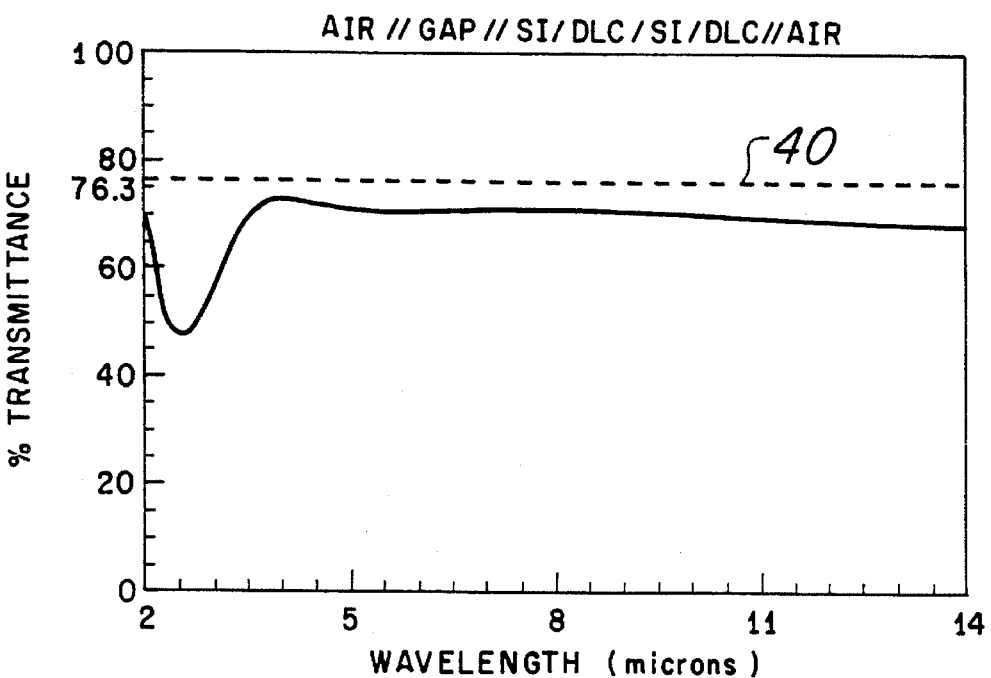

FIGS. 6–8 illustrate the same curves as FIGS. 5–7 except GaP is used as the window 10 instead of GaAs. The straight dotted line 40 at 76.3% represents the maximum transmittance through the GaP window 10 and coatings 12 and 16–20 also with no anti-reflectance coating on side 24 (FIG. 1) of window 10. FIGS. 6–8 illustrate that the coating 12 may be arbitrarily thick for GaP as well and still maintain optimization of the transmittance in the 3–5 and 8–12 micron range.

Although as shown above Si coating 12 may be arbitrarily thick, an optimum thickness appears to be about 30 microns, although depending upon the specific application this thickness may range between 20 and 2000 microns. Additionally, it has been determined that for the materials described in the Table above, DLC coating 16 and Si coating 18 will be less than 0.5 microns thick and DLC coating 20 will be less than 1 micron thick.

Silicon layers 12 and 18 may be formed using a vacuum coater manufactured by Leybold of W. Germany, by way of example. This coater would form or deposit the Si layer using an e-beam gun as a source at a base pressure equal to or less than $2 \times 10^{-6}$ torr at room temperature. The ion beam gun Ar+ would be at approximately 70 eV. The forming or deposition of the Si layers would take between 3 and 15 hours, depending on the thickness desired.

The DLC layers 16 and 20 can be formed and deposited on top of the silicon layers 12 and 18 utilizing RF plasma decomposition of a hydrocarbon gas such as is taught by Holland in U.S. Pat. No. 4,382,100. The formation/deposition of the DLC layers takes approximately 2 hours.

Although the present invention has been shown and illustrated in terms of a specific apparatus, it will be apparent that changes or modifications can be made without departing from the spirit and scope of the invention as defined by the appended claims.

What is claimed is:

1. A method for forming an ultra hard, dual band antireflection coating for a window comprising:

forming a first silicon layer of predetermined thickness;

forming a first diamond like carbon layer less than 0.5 micron thick on said first silicon layer;

forming a second silicon layer less than 0.5 micron thick on said first diamond like carbon layer; and forming a second DLC layer less than 1 micron thick on said second silicon layer to produce a coating which passes radiation in both the approximate 2–5 and 7–12 micron range.

2. A method according to claim 1 wherein forming a said first silicon layer is by ion aided electron beam deposition.

* * * * *